US006627944B2

United States Patent
Mandell et al.

(10) Patent No.: US 6,627,944 B2
(45) Date of Patent: Sep. 30, 2003

(54) FLOATING GATE MEMORY DEVICE USING COMPOSITE MOLECULAR MATERIAL

(75) Inventors: Aaron Mandell, Boston, MA (US); Andrew Perlman, Boston, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/139,331

(22) Filed: May 7, 2002

(65) Prior Publication Data

US 2002/0163030 A1 Nov. 7, 2002

Related U.S. Application Data

(60) Provisional application No. 60/289,091, filed on May 7, 2001.

(51) Int. Cl.[7] .............................. H01L 29/788
(52) U.S. Cl. ................. 257/315; 257/314; 438/201
(58) Field of Search ............... 257/314, 315; 438/201

(56) References Cited

U.S. PATENT DOCUMENTS

| | | | |
|---|---|---|---|
| 3,719,933 A | 3/1973 | Wakabayashi et al. | |
| 3,810,127 A | 5/1974 | Hoff, Jr. | |
| 4,267,558 A | * 5/1981 | Guterman | 257/315 |
| 4,267,583 A | 5/1981 | Suzuki | |
| 4,371,883 A | 2/1983 | Potember et al. | |
| 4,616,340 A | 10/1986 | Hayashi et al. | |
| 4,631,562 A | 12/1986 | Avery | |
| 4,652,894 A | 3/1987 | Potember et al. | |
| 4,677,742 A | 7/1987 | Johnson | |
| 4,727,514 A | 2/1988 | Bhuva et al. | |
| 4,733,375 A | 3/1988 | Terashima | |
| 4,834,911 A | 5/1989 | Carew | |
| 4,839,700 A | 6/1989 | Ramesham et al. | |
| 4,860,254 A | 8/1989 | Pott et al. | |
| 5,012,445 A | 4/1991 | Kazuaki et al. | |
| 5,034,192 A | 7/1991 | Wrighton et al. | |

(List continued on next page.)

FOREIGN PATENT DOCUMENTS

| | | |
|---|---|---|
| DE | 196 40 239 A1 | 4/1998 |
| DE | 199 59 904 A1 | 6/2001 |
| EP | 0 268 370 A3 | 5/1988 |
| EP | 0 385 688 A2 | 9/1990 |
| EP | 0 727 822 A2 | 8/1996 |
| JP | 7-106440 | 4/1995 |
| RU | 2071126 C1 | 12/1996 |
| WO | WO 93/04506 A1 | 3/1993 |

(List continued on next page.)

OTHER PUBLICATIONS

"A Disrupted Organic Film: Could Memories Be Made of This?," *ORNL Review*, vol. 33, No. 2, 2000.
"Technical Summary of Programmable Metallization Cell Memory Technology," Version 1.3, Dec. 2001.
"The 1998 Conference Archive," *The Sixth Foresight Conference on Molecular Nanotechnology*, Nov. 12–15, 1998, www.foresight.org/Conferences/MNT6/index.html.
Beck, A. et al., "Reproducible Switching Effect in Thin Oxide Films for Memory Applications," *Applied Physics Letters*, vol. 77, No. 1, pp. 139–141, Jul. 3, 2000.

(List continued on next page.)

*Primary Examiner*—Allan R. Wilson
(74) *Attorney, Agent, or Firm*—Amin & Turocy, LLP

(57) ABSTRACT

A floating gate memory device has a floating gate and an insulating layer on the floating gate. A control gate is on the insulating layer. The insulating layer is made up of a molecular matrix with ionic complexes distributed in the molecular matrix. By the application of an electric field, the ionic complexes are dissociable in the molecular matrix to change the resistivity (or conductivity) of the insulating layer. By switching between a high resistivity (low conductivity) state, where charge is retained by the floating gate, to a low resistivity (high conductivity) state, the charge stored on the floating gate can readily drained off to the gate electrode.

7 Claims, 4 Drawing Sheets

U.S. PATENT DOCUMENTS

| | | |
|---|---|---|
| 5,130,380 A | 7/1992 | Carew |
| 5,136,212 A | 8/1992 | Eguchi et al. |
| 5,153,681 A * | 10/1992 | Kishimoto et al. ......... 257/288 |
| 5,196,912 A | 3/1993 | Matsumoto et al. |
| 5,206,525 A * | 4/1993 | Yamamoto et al. ......... 257/347 |
| 5,245,543 A | 9/1993 | Smayling et al. |
| 5,296,716 A | 3/1994 | Ovshinsky et al. |
| 5,315,131 A * | 5/1994 | Kishimoto et al. ......... 257/212 |
| 5,319,564 A | 6/1994 | Smayling et al. |
| 5,355,235 A | 10/1994 | Nishizawa et al. |
| 5,392,236 A | 2/1995 | Hashimoto |
| 5,412,614 A | 5/1995 | Bird |
| RE34,974 E | 6/1995 | Terashima |
| 5,431,883 A * | 7/1995 | Barraud ...................... 257/253 |
| 5,440,518 A | 8/1995 | Hazani |
| 5,563,081 A | 10/1996 | Ozawa |
| 5,572,472 A | 11/1996 | Kearney et al. |
| 5,579,199 A | 11/1996 | Kawamura et al. |
| 5,670,818 A | 9/1997 | Forouhi et al. |
| 5,691,935 A | 11/1997 | Douglass |
| 5,698,874 A | 12/1997 | Hayashi |
| 5,734,605 A | 3/1998 | Zhu et al. |
| 5,761,115 A | 6/1998 | Kozicki et al. |
| 5,770,885 A | 6/1998 | McCollum et al. |
| 5,818,749 A | 10/1998 | Harshfield |
| 5,849,403 A | 12/1998 | Aoki et al. |
| 5,869,882 A | 2/1999 | Chen et al. |
| 5,896,312 A | 4/1999 | Kozicki et al. |
| 5,900,662 A | 5/1999 | Frisina et al. |
| 5,914,893 A | 6/1999 | Kozicki et al. |
| 6,055,180 A | 4/2000 | Gudesen et al. |
| 6,060,338 A | 5/2000 | Tanaka et al. |
| 6,064,589 A | 5/2000 | Walker |
| 6,088,319 A | 7/2000 | Gudesen |
| 6,118,684 A | 9/2000 | Yihong et al. |
| 6,128,214 A | 10/2000 | Kuekes et al. |
| 6,150,705 A | 11/2000 | Chen |
| 6,288,697 B1 | 9/2001 | Eto et al. |
| 6,292,396 B1 | 9/2001 | Tailliet |
| 6,326,936 B1 | 12/2001 | Inganas et al. |
| 6,349,054 B1 | 2/2002 | Hidaka |
| 6,353,559 B2 | 3/2002 | Hasegawa et al. |
| 6,384,427 B1 | 5/2002 | Yamazaki et al. |
| 6,403,396 B1 | 6/2002 | Gudesen et al. |
| 6,403,397 B1 | 6/2002 | Katz |
| 6,407,953 B1 | 6/2002 | Cleeves |
| 6,418,049 B1 | 7/2002 | Kozicki et al. |
| 6,424,553 B2 | 7/2002 | Berggren et al. |
| 6,426,891 B1 | 7/2002 | Katori |
| 6,429,457 B1 | 8/2002 | Berggren et al. |
| 6,432,739 B1 | 8/2002 | Gudesen et al. |
| 6,449,184 B2 | 9/2002 | Kato et al. |
| 6,459,095 B1 | 10/2002 | Heath et al. |
| 6,461,916 B1 | 10/2002 | Adachi et al. |
| 6,487,106 B1 | 11/2002 | Kozicki |
| 2001/0014038 A1 | 8/2001 | Hasegawa et al. |
| 2001/0054709 A1 | 12/2001 | Heath et al. |
| 2001/0055384 A1 | 12/2001 | Yamazaki et al. |
| 2002/0027819 A1 | 3/2002 | Tomanek et al. |
| 2002/0101763 A1 | 8/2002 | Hosogane et al. |
| 2002/0104889 A1 | 8/2002 | Forrest et al. |
| 2002/0125504 A1 | 9/2002 | Perlov et al. |
| 2002/0134979 A1 | 9/2002 | Yamazaki et al. |
| 2002/0163030 A1 | 11/2002 | Mandell et al. |
| 2002/0163057 A1 | 11/2002 | Bulovic et al. |
| 2002/0163828 A1 | 11/2002 | Krieger et al. |
| 2002/0163829 A1 | 11/2002 | Bulovic et al. |
| 2002/0163830 A1 | 11/2002 | Bulovic et al. |
| 2002/0163831 A1 | 11/2002 | Krieger et al. |
| 2002/0168820 A1 | 11/2002 | Kozicki et al. |

FOREIGN PATENT DOCUMENTS

| | | |
|---|---|---|
| WO | WO 99/04440 A1 | 1/1999 |
| WO | WO 99/08325 A2 | 2/1999 |
| WO | WO 99/14762 A1 | 3/1999 |
| WO | WO 99/19900 A2 | 4/1999 |
| WO | WO 00/26918 A1 | 5/2000 |
| WO | WO 00/48196 A1 | 8/2000 |
| WO | WO 02/35580 A2 | 5/2002 |
| WO | WO 02/37500 A1 | 5/2002 |
| WO | WO 02/43071 A1 | 5/2002 |
| WO | WO 02/078003 A2 | 10/2002 |
| WO | WO 02/091384 A1 | 11/2002 |
| WO | WO 02/091385 A1 | 11/2002 |
| WO | WO 02/091476 A1 | 11/2002 |
| WO | WO 02/091494 A1 | 11/2002 |
| WO | WO 02/091495 A2 | 11/2002 |
| WO | WO 02/091496 A2 | 11/2002 |
| WO | WO 03/017282 A1 | 2/2003 |

OTHER PUBLICATIONS

Bernard, Allen, "A Big Name in Chips Helps Coatue in Molecular Memory Race," Aug. 27, 2000, www.nanoelectronicsplanet.com/features/article/0,4028,6571–1452831, 00.html.

Chen, J. et al., "Room–temperature Negative Differential Resistance in Nanoscale Molecular Junctions," *Applied Physics Letters*, vol. 77, No. 8, Aug. 21, 2000.

Collier, C. P. et al., "Electrically Configurable Molecular–Based Logic Gates," *Science*, vol. 285, pp. 391–394, Jul. 16, 1999.

Gannon, Andrew, "Toward the Next Generation CD," *Physical Review Focus*, Feb. 16, 2000.

Gao, H. .J. et al., "Reversible Nanometer–Scale Conductance Transitions in an Organic Complex," *Physical Review Letters*, vol. 84, pp. 1780–1783, Feb. 21, 2000.

Gao, H. .J. et al., "Using a New Kind of Organic Complex System of Electrical Bistability for Ultrahigh Density Data Storage," J. Vac. Sci. Technol. B vol. 15, No.4, pp. 1581–1583, Jul./Aug. 1997.

International Search Report, PCT/RU01/00334, search completed Feb. 14, 2002.

International Search Report, PCTUS02/14236, search completed Aug. 14, 2002.

International Search Report, PCT/US02/14237, search completed Sep. 9, 2002.

International Search Report, PCT/US02/14238, search completed Aug. 9, 2002.

International Search Report, PCT/US02/14239, search completed Aug. 20, 2002.

International Search Report, PCT/US02/14269, search completed Mar. 27, 2003.

International Search Report, PCT/US02/14270, search completed Mar. 28, 2003.

Japanese patent abstract of publication No. 01–103137, Apr. 20, 1989.

Japanese patent abstract of publication No. 01278781, Nov. 9, 1989.

Japanese patent abstract of publication No. 61107723, May 26, 1986.

Japanese patent abstract of publication No. 63293729, Nov. 30, 1998.

Krieger, Ju. H. et al., "Molecular Analogue Memory Cell Based on Electrical Switching and Memory in Molecular Thin Films," *Synthetic Metals*, 7730 (2000), pp. 1–4.

Krieger, Juri H. et al., "Molecular Analogue Memory Cell," *Sixth Foresight Conference on Molecular Nanotechnology*, Santa Clara, California, Nov. 12–15, 1998.

Krieger, Yu. G. et al., "Study of Test Structures of a Molecular Memory Element," *Institute of Inorganic Chemistry*, Siberian Branch, Russian Academy of Sciences. Translated from *Zhurmal Strukturnoi Khimii*, vol. 34,No. 6, pp. 152–156, Nov.–Dec. 1993. Original article submitted Apr. 27, 1993.

Krieger, Yu. G., "Molecular Electronics: Current State and Future Trends," *Journal of Structural Chemistry*, vol. 34, No. 6, pp. 896–904, Nov.–Dec. 1993.

Krieger, Yu. H., "Structural Instability of One–Dimensional Systems as a Physical Principle Underlying the Functioning of Molecular Electronic Devices," *Journal of Structural Chemistry*, vol. 40, No. 4, pp. 594–619, Jul.–Aug. 1999.

Kurita, Ryo et al., "Field Modulation Effects on Charge–Density–Wave Conduction in $NbSe_3$," *Physica B*, 284–288 (2000), pp. 1161–1662.

Ma, L. P. et al., "Data Storage With 0.7 nm Recording Marks on a Crystalline Organic Thin Film by a Scanning Tunneling Microscope," *Applied Physics Letters*, vol. 73, No. 6, pp. 850–852, Aug. 10, 1998.

Ma. L.P. et al., "Nanometer–Scale Recording on an Organic Complex Thin Film With Scanning Tunneling Microscope," *Applied Physics Letters*, vol. 69, No. 24, pp. 3752–3753, Dec. 9, 1996.

Machida, Yasuhiko et al., "Electrical Switching in Evaporated Lead Phthalocyanine Films," *Japanese Journal of Applied Physics*, vol. 28, No. 2, pp. 297–298, Feb. 1989.

Ovshinsky, Stanford R., "Localized States in the Gap of Amorphous Semiconductors," *Physical Review Letters*, vol. 36, No. 24, pp. 1469–1472, Jun. 14, 1976.

Potember, R. S. et al., "Electrical Switching and Memory Phenomena in Cu–TCNQ Thin Films," *Applied Physics Letters*, vol. 34, No. 6, pp. 405–407, Mar. 15, 1979.

Reed, M.A. et al., "Molecular Random Access Memory Cell," *Applied Physics Letters*, vol. 78, No. 23, pp. 3735–3737, Jun. 4, 2001.

Rossel, C. et al., "Electrical Current Distribution Across a Metal–Insulator–Metal Structure During Bistable Switching," Apr. 24, 2001.

Rotman, David, "Molecular Memory," *Technology Review*, May 2001.

*Semiconductor Times*, pp. 5–6, Jul. 2002.

Stikeman, Alexandra, "Polymer Memory: The Plastic Path to Better Data Storage," *Technology Review*, p. 31, Sep. 2002.

Zhou, C. et al., "Nanoscale Metal/Self–Assembled Monolayer/Metal Heterostructures," *Applied Physics Letters*, vol. 71, No. 5, pp. 611–613, Aug. 4, 1997.

* cited by examiner

FLOATING GATE MEMORY DEVICE USING COMPOSITE MOLECULAR MATERIAL

RELATED APPLICATIONS

This application contains subject matter related to the subject matter disclosed in copending U.S. Provisional Patent Application Ser. No. 60/289,091, filed on May 7, 2001, entitled "Floating Gate Memory Device Using Composite Molecular Material".

FIELD OF THE INVENTION

The invention relates to a floating gate memory cell for data storage applications, and more particularly, to a floating gate memory device having a variable resistance dielectric as a gate insulator.

BACKGROUND OF THE INVENTION

Computer data storage, in particular random access memory (RAM) has become an increasingly important component of electronic hardware. There are various distinct types of memory devices, distinguished by their speed and data retention characteristic. Dynamic random access memory (DRAM) is a volatile memory characterized by a destructive read. This means that it is necessary to supply voltage to the memory bits at all times, or the information will disappear. Furthermore, each memory element has associated with it a transistor. Static random access memory (SRAM) stores data in a bistable flip-flop, commonly consisting of cross-coupled inverters. It is called "static" because it will retain a value as long as power is supplied. It is still volatile, i.e. it will lose its contents when the power is switched off, in contrast to ROM. SRAM is usually faster than DRAM, but each bit requires several transistors (about six), so that a lesser number of bits of SRAM fit in the same area as compared to DRAM.

When the gate electrode of a conventional MOSFET is modified so that semi-permanent charge storage inside the gate is possible, the new structure becomes a nonvolatile memory device (floating gate transistor). Nonvolatile memory devices have been extensively used in integrated circuits, such as the electrically alterable read-only memory (EAOM), the erasable-programmable read-only memory (EPROM), and the nonvolatile random-access memory (NVRAM).

In a floating gate transistor, charges are injected from the silicon across a first insulator and stored in the floating gate or at the insulator-oxide interface. The stored charge gives rise to a threshold voltage shift, and the device is at a higher-threshold voltage state. A long retention time is required for nonvolatile memory operation. The retention time is defined as a time when the stored charge decreases to 50% of its initial value. For a well-designed memory device, the charge retention time can be over 100 years. To erase the stored charge and return the device to a "low-threshold voltage state," a high reverse voltage is applied to the gate and/or the device is exposed to UV light. The conventional erase process is relatively slow.

There is a need for a floating gate memory device with decreased erase time and that does not require the application of UV light.

SUMMARY OF THE INVENTION

These and other needs are met by embodiments of the present invention which provide a floating gate memory device comprising a substrate and a first insulating layer on the substrate. A floating gate is provided on the first insulating layer, and a second insulating layer is on the floating gate. A control gate is formed on the second insulating layer. At least one of the first or the second insulating layers has a controllably variable resistivity.

In certain embodiments, at least one of the first and second insulating layers consists of a molecular matrix with ionic complexes distributed through the molecular matrix.

With the present invention, the resistivity (or conductivity) can be changed in response to the application of an electric field. By switching the resistivity from a highly resistive state, where charge is retained by the floating gate, to a lower resistivity state, the charge stored on the floating gate can be drained off to the gate electrode.

Other embodiments of the invention also satisfy the above-stated needs by providing a memory device comprising a first insulating layer, a floating gate on the first insulating layer, a second insulating layer on the floating gate, and a control gate on the second insulating layer. At least one of the first and second insulating layers comprises a material switchable between low and high conductivity states in response to an applied electric field.

The earlier stated needs are also met by further aspects of the present invention which provide a memory device comprising a floating gate, an insulating layer on the floating gate, and a control gate on the insulating layer. The insulating layer comprises a molecular matrix with ionic complexes distributed in the molecular matrix.

The earlier stated needs are also met by a still further aspect of the invention which provides a method of operating a floating gate memory device. This method comprises the steps of maintaining an insulating layer between a floating gate and a control gate in a first conductivity state that is sufficient to retain a floating gate charge for at least a predetermined period of time. An electric field is applied to the insulating layer to place the insulating layer in a second conductivity state having at least an order of magnitude greater conductivity than the first conductivity state sufficient to discharge the floating gate charge.

The foregoing and other features, aspects and advantages of the present invention will become more apparent from the following detailed description of the present invention when taken in conjunction with the accompanying drawings.

DETAILED DESCRIPTION OF THE INVENTION

Figure 1:
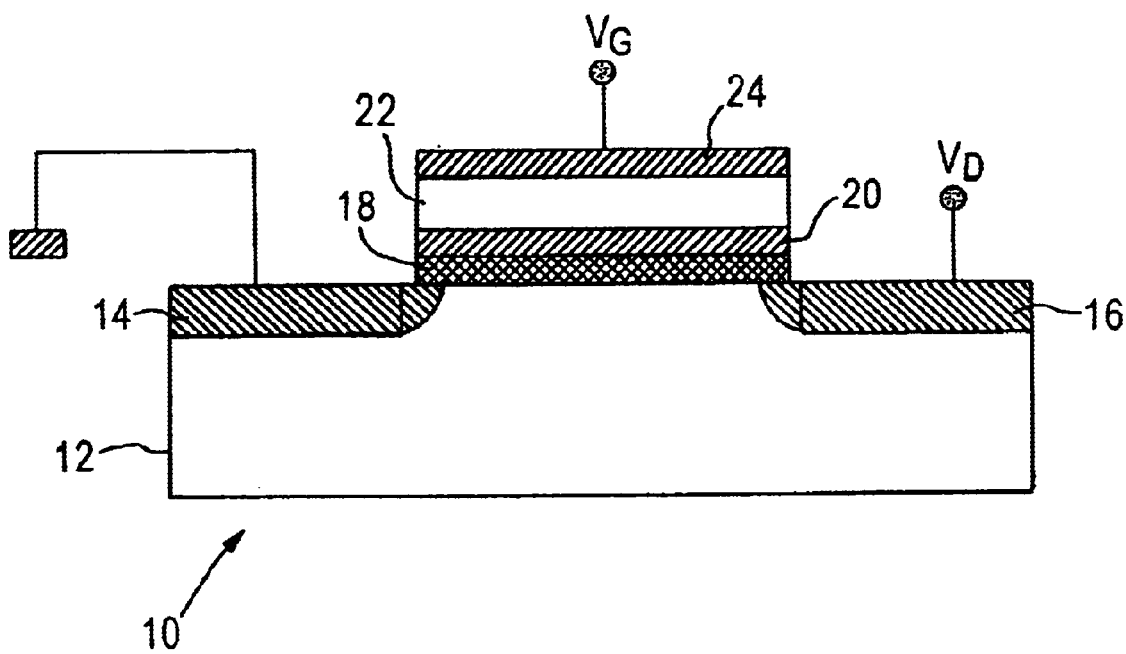
FIG. 1 shows a nonvolatile memory device that is a floating gate transistor constructed in accordance with an embodiment of the present invention.

Referring first to FIG. 1, a floating gate transistor may be considered to be a modified MOSFET transistor with a floating conductive pad embedded in the dielectric that insulates the gate from the source/drain. Because of the very high resistivity of commonly used dielectrics, such as $SiO_2$ and $Si_3O_4$, any electric charge deposited on the floating gate will remain there during the retention time of the device, which can be years. However, it is difficult to discharge the floating gate simply by applying a reverse external electric field because of the large electrical resistance of the tunnel barrier in the reverse direction. For this reason, the conductivity of the dielectric is typically enhanced by illuminating the dielectric with UV light. The present invention provides a structure that avoids the need for UV light.

The present invention address and solves problems related to the control and structure of a floating gate memory device. In particular, the present invention provides for a floating gate memory device that has an insulating layer that acts to either electrically insulate the floating gate from a control gate, or has an increased conductivity to allow for a rapid discharge of the floating gate charge. This is achieved, in part, by employing a floating gate transistor having an insulating layer between the control gate and the floating gate that comprises a composite material that exhibits structural electronic instability in one dimension and enables static and dynamic control over the conductivity of the composite material. As an exemplary composite material, a molecular matrix is employed with ionic complexes in the matrix. Under the application of an electric field, the ionic complexes dissociate controllably to change the electrical conductivity of the insulating layer.

FIG. 1 depicts an exemplary embodiment of the floating gate memory device constructed in accordance with present invention. The floating gate memory device includes substrate 12 in which are formed source and drain regions 14, 16, respectively.

A first insulator 18 is formed on the substrate 10 and spans the source and drain regions 14, 16. A floating gate 20 formed of conductive material, is formed on the first insulating layer 18. A second insulating layer 22 is formed on the floating gate 20, followed by the formation of gate electrode 24 on the second insulating layer 22. The gate electrode 24 and the drain region 16 are depicted as being connected to voltages $V_g$ and $V_d$, respectively. The gate electrode 24, like the floating gate 20, comprises a conductive material.

According to certain embodiments, at least one of the two dielectric layers 18, 22 depicted in FIG. 1 comprise a one-dimensional molecular system exhibiting a transition from a low electrical conductivity to a high electrical conductivity and vice versa. This transition is typically manifested by an S-shaped (reentrant) voltage-current characteristic with metastable or stable memory. The impedance of such memory cells can be between ~10 M Ω and ~100 Ω for example, depending on the switching condition. Examples of such molecular systems are systems with a low dimensionality exhibiting a so-called Peierls transition.

A number of different materials may be used as the insulating layers 18, 22. Exemplary materials are described in more detail below, but are also discussed in an article by Yu H. Krieger, entitled *"Structural Instability of One-Dimensional Systems as a Physical Principle Underlying the Functioning of Molecular Electronic Devices"*, Journal of Structural Chemistry, Vol. 40, No. 4, 1999 (Yu H. Krieger), expressly incorporated by reference herein.

There are two predominant types of structural organization of such systems. First, there are strands of linear conjugated polymers, which are weakly bonded to each other and whose mutual arrangement is generally poorly organized. Second, there are crystal structures, where the individual molecules form one-dimensional columns and interact with each other much more actively than molecules from different columns do.

Polyconjugated systems primarily involve polyvinylenes, i.e., polymers with an acyclic conjugation system, in which the one-dimensional character of structure is dictated by the mechanism of conjugation in linear macromolecules. Polyacetylene is a classical representative of this class of polymers. Its electronic structure is a prototype for many other conjugated polymers.

Another wide class of molecular compounds are formed from aromatic and heterocyclic molecules which possess high electric conductivity due to $\pi$-bonds between molecules. Such molecular systems are called $\pi$-complexes or charge transfer complexes, with those systems whose structure involves isolated one-dimensional columns or strands possessing pronounced electro-physical properties of interest for switching and memory applications. Molecular charge transfer complexes are donor-acceptor systems formed from two molecules: one possessing donor and another acceptor properties. Among the well-defined complexes with a one-dimensional structure, tetra-cyano-quinodimethane (TCNQ) are planar molecules with unsaturated bonds, arranged in a crystal as parallel stacks forming a quasi-one-dimensional system.

In another class of one-dimensional systems, the cations are dynamically disordered. It involves molecular compounds having the general formula $(TMTSF)_2X$. Transition metal salts of $K_2Pt(CN)_4Br_{0.3}\times 3H_2O(KCP)$ type are also the typical representatives of mixed-valence quasi-one-dimensional complexes, as are phthalocyanines and porphyrins. Moreover, pure inorganic compounds, such as $NbSe_3$, are also interesting examples of compounds with quasi-one-dimensional structure.

While not being bound by theory, the following is currently believed by the inventors to describe the mechanism for the conductivity change in the material in the present invention. An exemplary molecular composite that can be applied as at least one of the insulating layers 18, 22 in the floating gate transistor 10 is shown in FIGS. 2a–2d. The molecular composite includes a quasi-one-dimensional, or at least structurally and electrically anisotropic, molecular matrix, wherein ionic complexes are distributed in the matrix. Polyconjugated compounds, such as the exemplary quasi-one-dimensional systems described above, for example, polyphenylacetylene, can be used as the anisotropic molecular matrix. The ionic complex can be a salt, such as sodium chloride (NaCl), or any other material that can dissociate in an applied electric field. The exemplary anisotropic molecular matrix is depicted in FIGS. 2a–d as comprising an assembly of chain-like molecules oriented perpendicular to the electrode surfaces. However, other orientations of those molecules or of anisotropic "channels" are possible as long as a charge separation of the type depicted in FIGS. 2a–d is enabled.

Electric switching in the molecular thin films depicted in FIGS. 2a–d is characterized by the existence of two stable states, a high impedance state ("off" state) and a low impedance state ("on" state). The impedance of this "off" state is usually more than ~10 M Ω., for example. Switching from the "off" state to the "on" state occurs when an applied electric field exceeds a threshold value. The impedance of this "on" state can be less than ~100 Ω., for example. A transition from "on" state back to the "off" state can take place by reversing the polarity of the electric field.

Figure 2A:
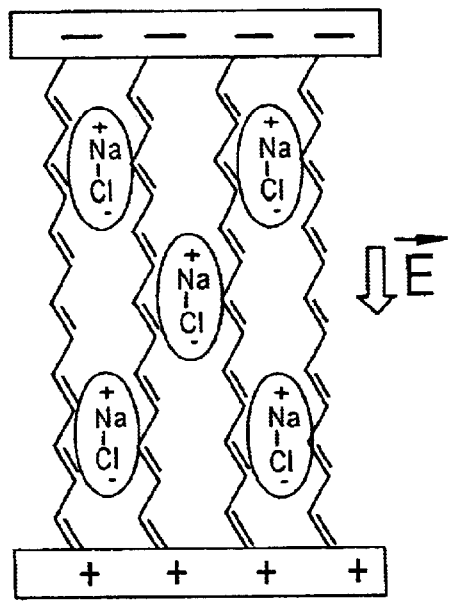
FIGS. 2a–d show a molecular composite material between two electrodes in various operational states according to a current theoretical understanding of the invention.
Figure 2B:
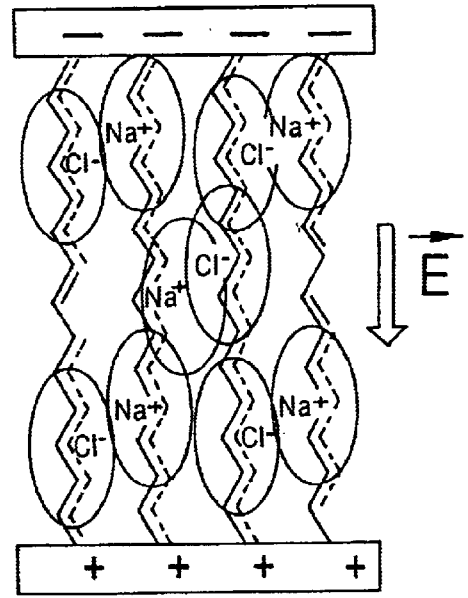
Figure 2C:
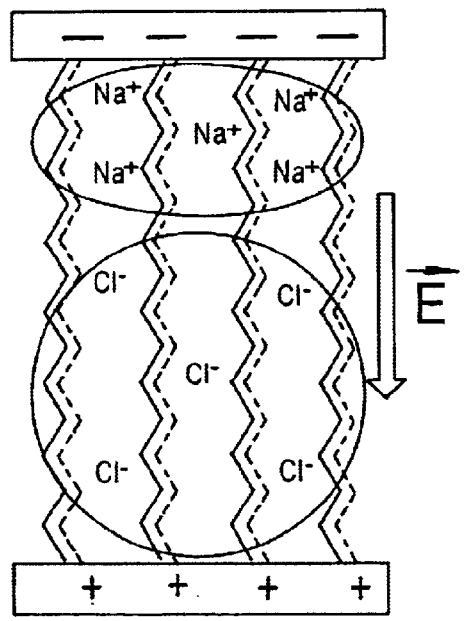
Figure 2D:
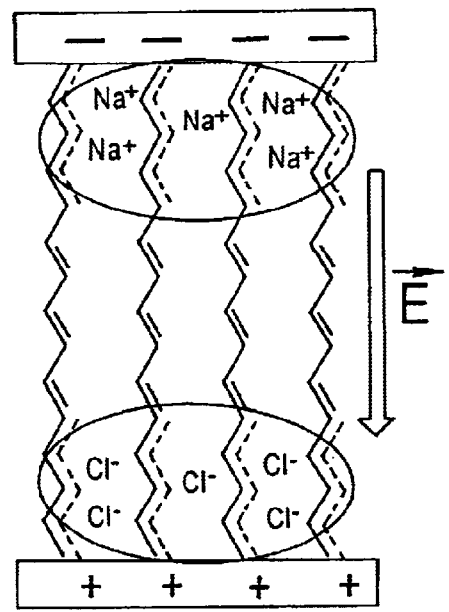

Two modes of the "on" state are identifiable: a metastable mode (FIG. 2b) and a stable mode (FIG. 2c). The metastable mode of the memory cell function is characterized by the low $P_W$ and $P_{ER}$ value (0.1–0.5V), high impedance of the "ON" state (wide region, about 1 k Ω–1M Ω), short switching time (less than 1 µs), and short retention time between about 10 s or several hours. Conversely, the stable mode of the memory cell operation shows the high $P_W$ and $P_{ER}$ value (3–10V), low impedance of the "ON" state (less than 100 Ω), long switching time (1 ms and more) and long storage time (between several months and years). Some memory cells made from this material have been observed to exhibit substantially unchanged electrical properties in the stable mode after storage for six years.

FIG. 2a illustrates the "off" state, where the electrical conductivity is essentially zero, assuming that the anisotropic molecular matrix itself is a good electrical insulator. When an external electric field E is applied, as indicated in FIG. 2b, the sodium salt dissociates into sodium and chlorine ions, and the ions are displaced from their original position in the anisotropic molecular matrix, resulting in an increase in the electrical conductivity to the metastable "on" state. Upon further increase of the electric field, the ions become more strongly separated (FIG. 2c), accompanied by a still further increase in the conductivity of the "on" state to the above-described stable state. When a very large field is applied over a long time, the anions and cations accumulate at the electrodes (FIG. 2d), resulting in a sharp decrease in the electrical conductivity due to the absence of mobile charges ("off" state).

The electrode material can be, for example, a metal, such as Al or Cu, ITO, a semiconductor or a conducting polymer. The transition from the "off" state depicted in FIG. 2a to the "on" state depicted in FIG. 2b requires application of an external voltage of approximately 3–5 V for a time period of approximately 10–100 ns. The transition from the "off" state depicted in FIG. 2a to the "on" state depicted in FIG. 2c having a higher electrical conductivity and longer retention time is achieved by applying an external voltage of approximately 3–5 V for a time period of approximately 300 ns–1 µs. A molecular composite comprising polyphenylacetylene and ~5–7% NaCl as the ionic complex are described in these figures as an exemplary embodiment.

In an application as a variable conductivity gate insulator with a floating gate transistor, replacing at least one of the traditional dielectrics (e.g., insulating layer 22), the conductivity is switched between a low conductivity state, where charge is retained by the floating gate, and a higher conductivity state, where the charge stored on the floating gate 20 can be drained off to the gate electrode 27. The floating gate 20 can thereafter be restored to its original state, i.e., isolated from the gate 24, by applying a reverse potential between the source/drain 14, 16 and the gate electrode 24.

Figure 3:
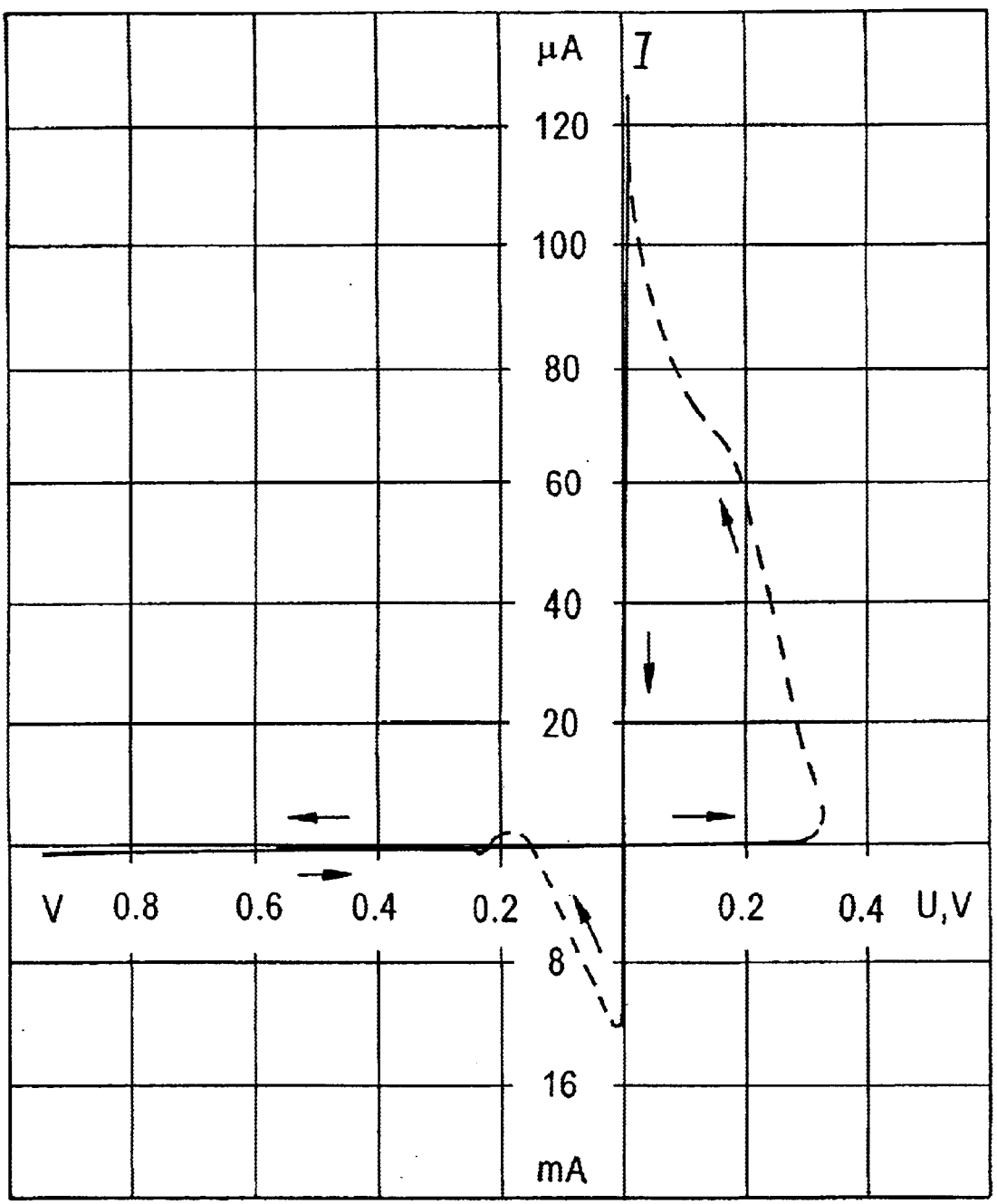
FIG. 3 shows a voltage-current characteristic for write and erase operation of the memory device of the present invention.

The current-voltage (I-V) characteristic of a floating gate transistor, as it applies to the state of the composite material forming, for example, insulating layer 22, is shown in FIG. 3. The positive voltage applied to the gate electrode with respect to the ground will be referred to as write voltage (in pulsed experiments, as write pulse) ($P_W$), which renders the insulating layer 22 conductive, and the negative voltage, which restores the insulating properties of insulating layer 22, as erase voltage (or erase pulse) ($P_{ER}$), respectively.

FIG. 3 shows a typical I-V curve for write (positive applied voltage) and erase operation (negative applied voltage). The device is in the "off" state, until the applied voltage reaches a critical value of approximately 0.3 V. In the "off" state, the electric current through the memory cell is essentially zero. When the applied voltage exceeds the critical voltage of 0.3V, the memory cell 10 approaches zero resistance, with the voltage across the cell dropping to a very small value and the current increasing to more than 120 µA, with the cell attaining the "on" state. The cell remains in the "on" state until a negative voltage is applied, which in the present example is approximately –1 V. This represents the erase cycle. After the erase cycle is completed, the cell is again in the "off" state. The parameters (voltage, pulse duration) used for the erase operation depend on the characteristic values of the "on" state of the device.

Figure 4:
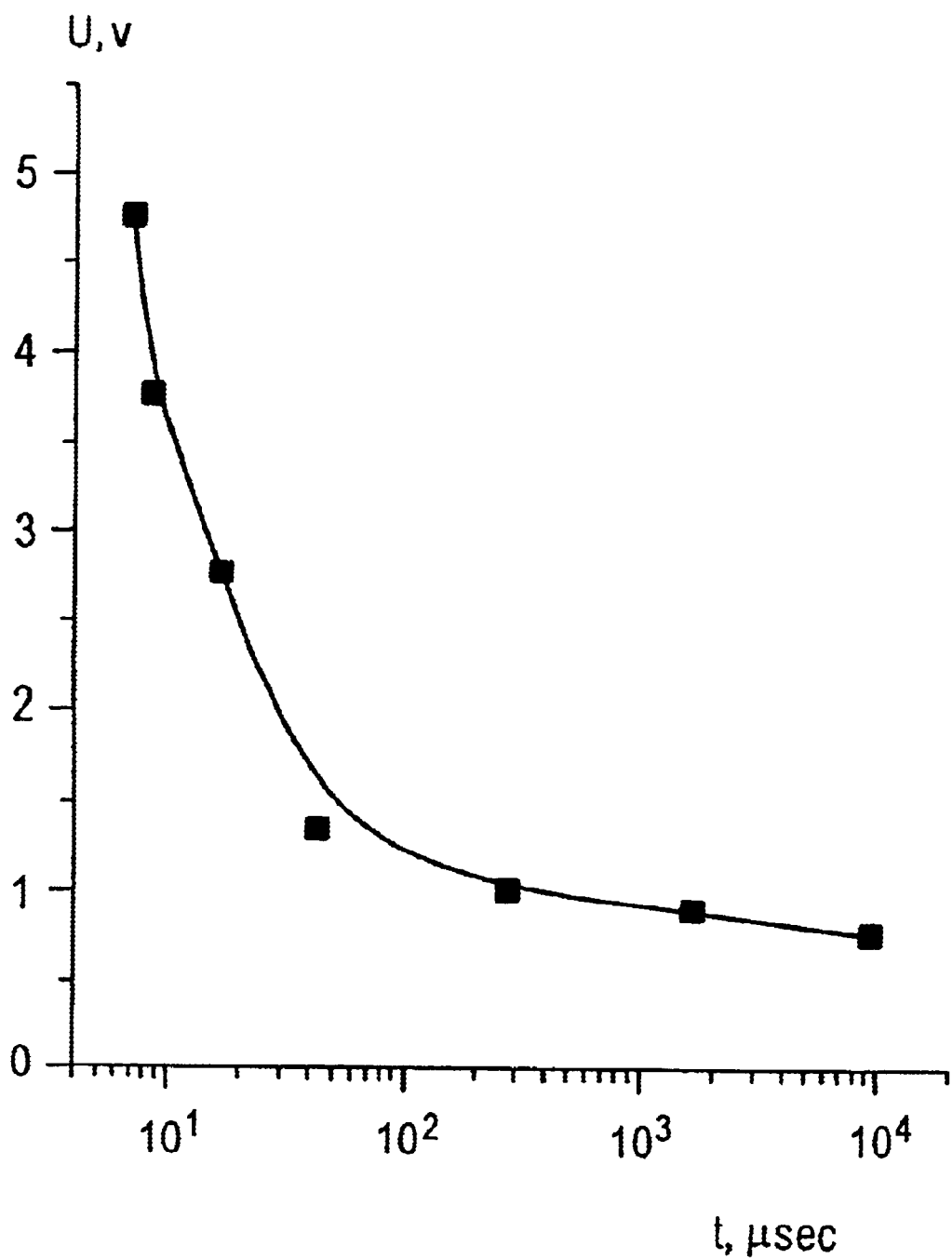
FIG. 4 shows the dependence on writing pulse critical amplitude on writing pulse time.

Referring now to FIG. 4, the pulse duration of a write pulse required to change the conductivity of the insulating layer 22 is related to the amplitude of the write pulse. For example, insulating layer 22 may be switched from the "off" state to the "on" state by applying a pulse of 4 V for 10 µs, whereas a pulse duration of more than 1 ms may be required when writing with a voltage of approximately 1 V. Accordingly, the speed with which the conductivity of the insulating layer 22 of the device 10 changes can be adapted to specific applications.

The present invention thus provides an easily erasable floating gate transistor memory chip for systems, employing molecular memory cells. The electronic circuitry of the erasable floating gate transistor memory chip can be based on that of well-developed DRAM chips. Depending on the "state" of the memory cell, i.e., a metastable or stable state, the circuit can work as either SRAM or DRAM.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A floating gate memory device, comprising:
   a substrate;
   a first insulating layer on the substrate;
   a floating gate on the first insulating layer;
   a second insulating layer on the floating gate;
   a control gate on the second insulating layer;
   wherein at least one of the first and second layers has a controllably variable resistivity, at least one of the first and second insulating layers having a molecular matrix with ionic complexes that are distributed through the molecular matrix and that are dissociable in the molecular matrix under the influence of an applied electronic field, the molecular matrix comprising a quasi-one-dimensional complex that is a phtalocyanine.

2. A floating gate memory device, comprising:
   a substrate;
   a first insulating layer on the substrate;
   a floating gate on the first insulating layer;
   a second insulating layer on the floating gate;
   a control gate on the second insulating layer;
   wherein at least one of the first and second layers has a controllably variable resistivity, at least one of the first and second insulating layers having a molecular matrix with ionic complexes that are distributed through the molecular matrix and that are dissociable in the molecular matrix under the influence of an applied electronic field, the molecular matrix comprising a quasi-one-dimensional complex that is a porphyrin.

3. A floating gate memory device, comprising:
   a substrate;
   a first insulating layer on the substrate;

a floating gate on the first insulating layer;

a second insulating layer on the floating gate;

a control gate on the second insulating layer;

wherein at least one of the first and second layers has a controllably variable resistivity, at least one of the first and second insulating layers having a molecular matrix with ionic complexes that are distributed through the molecular matrix and that are dissociable in the molecular matrix under the influence of an applied electronic field, the molecular matrix being an anisotropic inorganic material that is $NBSe_3$.

4. A floating gate memory device, comprising:

a substrate;

a first insulating layer on the substrate;

a floating gate on the first insulating layer;

a second insulating layer on the floating gate;

a control gate on the second insulating layer;

wherein at least one of the first and second layers has a controllably variable resistivity, at least one of the first and second insulating layers having a molecular matrix with ionic complexes that are distributed through the molecular matrix and that are dissociable in the molecular matrix under the influence of an applied electronic field, the molecular matrix being a molecular compound of $(TMTSF)_2X$.

5. A floating gate memory device, comprising:

a substrate;

a first insulating layer on the substrate;

a floating gate on the first insulating layer;

a second insulating layer on the floating gate;

a control gate on the second insulating layer;

wherein at least one of the first and second layers has a controllably variable resistivity, at least one of the first and second insulating layers having a molecular matrix with ionic complexes that are distributed through the molecular matrix and that are dissociable in the molecular matrix under the influence of an applied electronic field, the molecular matrix being a transition metal salt of $K_2Pt(CN)_4Br_{0.3} \times 3H_2O(KCP)$ type.

6. A memory device comprising:

a first insulating layer;

a floating gate on the first insulating layer;

a second insulating layer on the floating gate; and a control gate on the second insulating layer;

wherein at least one of the first and second insulating layers comprises a material switchable between low and high conductivity states in response to an applied electric field, the material being a molecular matrix with ionic complexes that are distributed through the molecular matrix and that are dissociable in the molecular matrix under the influence of an applied electric field, the molecular matrix comprising a quasi-one-dimensional complex that is at least one of a phtalocyanine or a porphyrin.

7. A memory device comprising:

a floating device;

an insulating layer on the floating gate; and a control gate on the insulating layer;

wherein the insulating layer comprises a molecular matrix with ionic complexes distributed in the molecular matrix, the molecular matrix comprising a quasi-one-dimensional complex that is a least one of a phtalocyanine or a porphrin.

* * * * *